(12) United States Patent
Theuss et al.

(10) Patent No.: US 9,076,717 B2
(45) Date of Patent: Jul. 7, 2015

(54) SEMICONDUCTOR COMPONENT COMPRISING MAGNETIC FIELD SENSOR

(75) Inventors: Horst Theuss, Wenzenbach (DE); Albert Auburger, Karlstein (DE)

(73) Assignee: Infineon Technologies AG, Munich (DE)

( * ) Notice: Subject to any disclaimer, the term of this patent is extended or adjusted under 35 U.S.C. 154(b) by 1579 days.

(21) Appl. No.: 11/608,507

(22) Filed: Dec. 8, 2006

(65) Prior Publication Data

US 2008/0135959 A1 Jun. 12, 2008

(51) Int. Cl.
*H01L 29/78* (2006.01)
*H01L 27/22* (2006.01)
*G01R 33/00* (2006.01)
*G01R 33/07* (2006.01)
*G01R 33/09* (2006.01)

(52) U.S. Cl.
CPC ............ *H01L 27/22* (2013.01); *G01R 33/0005* (2013.01); *G01R 33/072* (2013.01); *G01R 33/091* (2013.01)

(58) Field of Classification Search
CPC ................................ H01L 27/22; H01L 43/08
USPC .......................................................... 257/414
See application file for complete search history.

(56) References Cited

U.S. PATENT DOCUMENTS

| | | | |
|---|---|---|---|
| 4,103,315 A | 7/1978 | Hempstead et al. | |
| 5,196,821 A * | 3/1993 | Partin et al. | 338/32 R |
| 5,260,653 A | 11/1993 | Smith et al. | |
| 5,324,977 A | 6/1994 | Honda et al. | |
| 6,369,435 B1 * | 4/2002 | Igel | 257/415 |
| 6,949,386 B2 | 9/2005 | Piguet et al. | |
| 2004/0105195 A1 | 6/2004 | Fontana, Jr. et al. | |
| 2005/0258820 A1 | 11/2005 | Forster | |
| 2006/0097332 A1 | 5/2006 | De Jongh et al. | |
| 2006/0202291 A1 | 9/2006 | Kolb et al. | |
| 2006/0202692 A1 | 9/2006 | Tatschl et al. | |
| 2006/0255797 A1 | 11/2006 | Taylor et al. | |

FOREIGN PATENT DOCUMENTS

| | | |
|---|---|---|
| DE | 2827429 | 1/1979 |
| DE | 3426785 | 1/1986 |
| DE | 9215228 | 5/1993 |
| DE | 68914215 | 7/1994 |
| DE | 3750158 | 11/1994 |
| DE | 69325682 | 2/2000 |
| DE | 10027641 | 1/2002 |
| DE | 103 38 471 | 3/2005 |
| DE | 102004017191 | 10/2005 |
| DE | 102005047414 | 8/2006 |
| DE | 102005047413 | 9/2006 |

(Continued)

OTHER PUBLICATIONS

J. Zimmer et al., "Integrated Giant Magnetic Resistance Technology for Automotive Sensor Application," Advanced Microsystems for Automotive Applications 2006, pp. 323-324, presented on Apr. 26, 2006, at AMAA 2006 Conference at Berlin, Germany.

*Primary Examiner* — Jack Chen
(74) *Attorney, Agent, or Firm* — Patterson & Sheridan, LLP (57) ABSTRACT

The invention relates to a semiconductor component (100) comprising a semiconductor chip (10) configured as a wafer level package, a magnetic field sensor (11) being integrated into said semiconductor chip.

19 Claims, 6 Drawing Sheets

(56) References Cited

\* cited by examiner

FOREIGN PATENT DOCUMENTS

| EP | 0415576 | 3/1991 |
| EP | 0867725 | 9/1998 |
| EP | 1580568 | 9/2005 |

SEMICONDUCTOR COMPONENT COMPRISING MAGNETIC FIELD SENSOR

The invention relates to a semiconductor component comprising a magnetic field sensor. The invention furthermore relates to a method for producing a semiconductor component of this type.

Semiconductor components comprising magnetic field sensors are used e.g. as position sensors or rate-of-rotation sensors. By way of example, semiconductor components of this type are integrated into clamshell telephones or into doors or the surroundings thereof in order to be able to ascertain whether the clamshell telephone or the door is open or closed.

Against this background, a semiconductor device and also a method are specified.

In accordance with one configuration, a semiconductor component comprises a semiconductor chip configured as a wafer level package. A magnetic field sensor is integrated into the semiconductor chip.

In accordance with a further configuration, a semiconductor component comprises a semiconductor chip, into which a magnetic field sensor is integrated, and external contact elements. The external contact elements are applied to an active main surface of the semiconductor chip.

In accordance with a further configuration, a semiconductor component comprises a semiconductor chip, into which a magnetic field sensor is integrated, and a magnet applied to a first main surface of the semiconductor chip.

In accordance with a further configuration, a carrier is provided, which comprises a plurality of integrated circuits. At least one first one of the integrated circuits comprises a magnetic field sensor. External contact elements are applied to a main surface of the carrier. The integrated circuits are singulated after the application of the external contact elements.

The invention is explained in more detail below in exemplary fashion with reference to the drawings, in which.

Semiconductor components comprising semiconductor chips which have magnetic field sensors are described below.

The invention is independent of the type of magnetic field sensors. By way of example, the magnetic field sensors may be Hall elements or GMR sensors, which utilize the Hall effect or the GMR (Giant MagnetoResistance) effect, respectively, for measuring a magnetic field. The magnetic field sensors can measure for example an absolute defining quantity of a magnetic field, such as e.g. the magnetic field strength or changes in a magnetic field.

In accordance with one configuration, the semiconductor chip, into which a magnetic field sensor is integrated, is formed as a Wafer Level Package (WLP). In this case, the term "Wafer Level Package" relates to semiconductor chips having one active main surface that has been populated at the wafer level with external contact elements that are required for subsequently making contact with a printed circuit board. The semiconductor chips (dies) have been singulated only after the application of the external contact elements. After singulation, a WLP can be mounted onto a printed circuit board without significant further processing of the main surface. In particular, mounting of the WLPs onto an interposer or a leadframe and potting of the individual WLPs with a potting material are no longer necessary. Potting material also need not subsequently be filled into the interspace between WLP and printed circuit board ("underfill"). WLPs are therefore distinguished by small size, small weight and no production costs.

Since the dimensions of a wafer level package are either equal in magnitude to those of the semiconductor chip or only insignificantly larger, an expression that is also often used is chip size packages or chip scale packages. A chip size package is approximately the same size as the semiconductor chip, while a chip scale package is up to 30% larger than the semiconductor chip.

In accordance with one configuration, the active main surface of the semiconductor chip is provided with external contact elements. Active main surface is to be understood to mean the surface of the semiconductor chip on or in which e.g. the magnetic field sensor or electrically operable structures or circuits are situated. The external contact elements may comprise e.g. metalized contact areas, underbump metalizations or solder deposits, for example in the form of solder balls. The external contact elements are provided for making electrical contact with the semiconductor chip externally. At the same time, the external contact elements may serve for holding the semiconductor chip mechanically in a fixed position in relation to a conductor track substrate, e.g. a PCB board (Printed Circuit Board), or ceramic. By way of example, the semiconductor chip is mounted in a flip-chip position onto a printed circuit board and the external contact elements produce an electrical connection between the semiconductor chip and the printed circuit board.

Figures 1, 2:
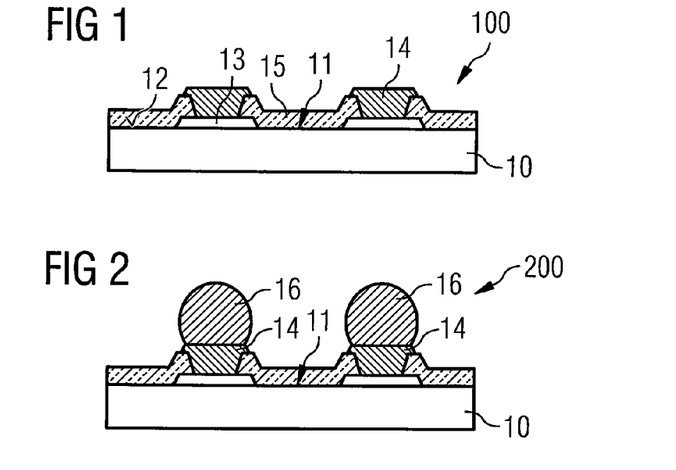
FIG. 1 shows a schematic illustration of a semiconductor component 100 as an exemplary embodiment of the invention.
FIG. 2 shows a schematic illustration of a semiconductor component 200 as a further exemplary embodiment of the invention.

FIG. 1 illustrates a semiconductor component 100 in cross section as an exemplary embodiment of the invention. The semiconductor component 100 has a semiconductor chip 10, into which a magnetic field sensor 11 is integrated. Furthermore, the semiconductor component 100 has external contact elements arranged on an active main surface 12 of the semiconductor chip 10, said external contact elements comprising a structured metalization layer 13 and underbump metalizations 14 in the case of the semiconductor component 100.

The magnetic field sensor 11 integrated into the semiconductor chip 10 is designed to measure a magnetic field or changes in a magnetic field. For this purpose, the magnetic field sensor 11 may measure a quantity defining the magnetic field, such as e.g. the magnetic field strength, or changes in such a quantity. Furthermore, the magnetic field sensor 11 may be configured in such a way that it ascertains whether or not the magnetic field prevailing at the location of the magnetic field sensor 11 exceeds a predetermined threshold value. By way of example, the magnetic field sensor 11 may be a Hall element or a GMR sensor, which utilizes the Hall effect or the GMR effect, respectively, for measuring the magnetic field. The semiconductor chip 10 may contain circuits which drive the magnetic field sensor 11 and/or evaluate measurement signals recorded by the magnetic field sensor 11. As an alternative, control and evaluation circuits of this type may also be integrated into a further semiconductor chip that interacts with the semiconductor chip 10. Furthermore, the semiconductor chip 10 may be configured for example as a position and/or rate-of-rotation sensor.

The active main surface 12 has contact elements which can be used to make electrical contact with the electrically operable structures or circuits. The structured metalization layer 13 is deposited on the contact elements of the active main surface 12. The structured metalization layer 13 may comprise a metal such as e.g. aluminium, copper or gold, or an electrically conductive alloy.

Furthermore, a passivation layer 15 comprising a polymer-containing material, for example, is deposited on the active main surface 12 of the semiconductor chip 10. The passivation layer is typically 5 µm to 20 µm thick and may for example also comprise a plurality of layers. It serves to protect the active main surface 12 against environmental influences such as e.g. dirt, moisture or else mechanical impacts. The passivation layer 15 has been opened in the regions of the structured metalization layer 13 by means of photolithographic methods, with the result that said regions are available for externally making contact with the semiconductor chip 10. The underbump metalizations 14 are applied to the uncovered regions of the structured metalization layer 13.

The underbump metalizations 14 may serve for example as an adhesion promoter for the solder material that is to be applied later. Furthermore, the underbump metalizations 14 may be provided for forming a diffusion barrier that prevents the material of the structured metalization layer 13 from diffusing into the solder material. A further task of the underbump metalizations 14 may be to reduce the contact resistance between the structured metalization layer 13 and the solder material. AlNiVCu, TiW, Au, Ni and NiP shall be mentioned, by way of example, as materials for the underbump metalizations 14. The underbump metalizations 14 may be deposited and structured for example like metalization layers.

Solder deposits, for example in the form of solder balls 16, may be applied to the underbump metalizations 14. This is illustrated in FIG. 2. The semiconductor component 200 shown therein as a further exemplary embodiment of the invention corresponds to the semiconductor component 100 otherwise. The suitable solder material includes alloys composed for example of the following materials: SnPb, SnAg, SnAgCu, SnAgCuNi, AuSn, CuSn and SnBi. The solder balls 16 are applied by means of so-called "ball placement", for example, in which preformed balls made of solder material are applied to the underbump metalizations 14. The adhesion between the solder balls 16 and the underbump metalizations 14 is brought about by a flux that has been printed on beforehand by means of stencil printing. The application of the solder balls 14 may be followed by a thermal process (reflow) in which the solder material melts and wets the contact elements. As an alternative to the "ball placement", the solder balls may be applied for example by means of stencil printing with a solder paste with a subsequent thermal process (reflow) or by electroplating and optional subsequent thermal process (reflow).

In the case of the semiconductor component 100, the semiconductor chip together with the external contact elements comprising the structured metalization layer 13 and the underbump metalizations 14 forms a wafer level package. In the case of the semiconductor component 200, the external contact elements additionally also contain the solder balls 16. In the case of a wafer level package, the external contact elements are applied to the active main surface 12 of the semiconductor chip 10 at a point in time at which the semiconductor chip 10 is still part of a semiconductor wafer. It is only in a later work step that the semiconductor chip 10 is separated from the semiconductor wafer. Such a production method will be explained in greater detail further below in connection with FIG. 6.

The semiconductor component 100 or 200 can be mounted onto a printed circuit board or some other substrate. This is illustrated using the example of the semiconductor component 200 in FIG. 3. The semiconductor component 200 is mounted onto a printed circuit board 17 in a flip-chip position, that is to say that the active main surface 12 of the semiconductor chip 10 faces the printed circuit board 17. Soldering Connections Between the Semiconductor chip 10 and contact elements 18 of the printed circuit board 17 were produced by means of the solder balls 16.

Figure 3:
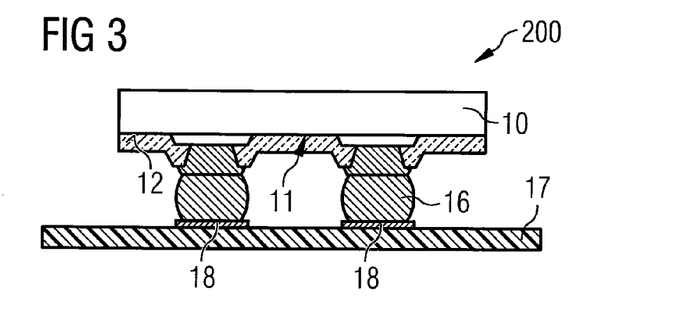
FIG. 3 shows a schematic illustration of the semiconductor component 200 arranged on a printed circuit board 17.

In the case of the arrangement shown in FIG. 3, the interspace between the semiconductor component 200 and the printed circuit board 17 is not filled with a potting composition, such as e.g. a plastic material or globe top, that is to say that a so-called underfill is not introduced between the semiconductor component 200 and the printed circuit board 17.

The semiconductor components 100 and 200 can be produced in a simple and cost-effective manner with the aid of wafer level packaging technologies. Cost-effective wafer processes can be used for fabricating the external contact elements and otherwise customary steps for producing a housing, such as e.g. encapsulation with a potting composition by injection moulding, can be obviated. Furthermore, the semiconductor components 100 and 200 have a compact size, so that they can be integrated into application devices, such as e.g. telephones, in a space-saving manner.

A rewiring layer may optionally be arranged between the active main surface 12 of the semiconductor chip 10 and the metalization layer 13. The rewiring layer serves for connecting the contact elements integrated into the active main surface 12 to the external contact elements, if the external contact elements are not situated directly above the contact elements of the active main surface 12. Accordingly, any desired arrangement of the external contact elements is made possible by means of a rewiring layer. The rewiring layer comprises conductor tracks leading from the contact elements of the active main surface 12 to the desired locations for the external contact elements. If appropriate, further insulation layers may be provided above and/or below the rewiring layer.

Figure 4:
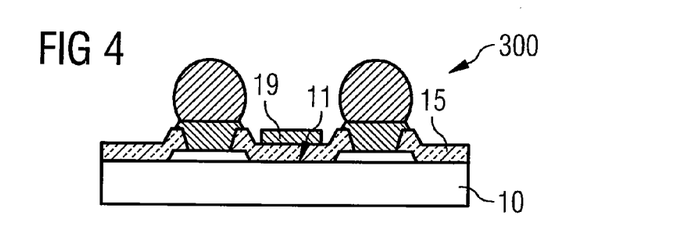
FIG. 4 shows a schematic illustration of a semiconductor component 300 as a further exemplary embodiment of the invention.
Figure 5:
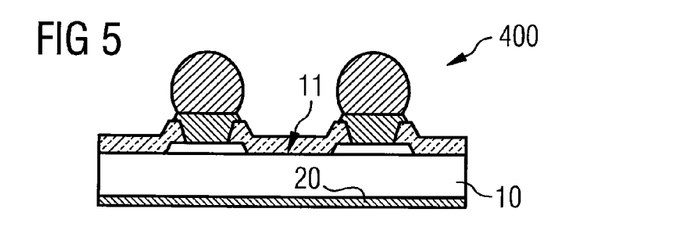
FIG. 5 shows a schematic illustration of a semiconductor component 400 as a further exemplary embodiment of the invention.

FIGS. 4 and 5 show semiconductor components 300 and 400 representing developments of the semiconductor components 100 and 200. In both semiconductor components 300 and 400, a magnet was applied to the respective wafer level package. The semiconductor component 300 has a magnet 19 on the passivation layer 15 directly above the magnetic field sensor 11. In the case of the semiconductor component 400, a magnet 20 was applied to the rear side of the semiconductor chip 10.

The magnets 19 and 20 serve to generate a magnetic field at the location of the magnetic field sensor 11. This makes it possible to detect the approach of a magnet or of soft-magnetic materials having low coercive field strengths to the magnetic field sensor 11. If a magnet or a soft-magnetic material is brought into the vicinity of the magnetic field sensor 11, then the magnetic field generated by the magnet 19 or 20 changes as a result. This change can be detected by the magnetic field sensor 11. One advantage of the semiconductor components 300 and 400 is that the magnets 19 and 20 are situated very close to the magnetic field sensor 11. This increases the sensitivity of the magnetic field sensor 11.

Soft-magnetic materials may be for example alloys composed of iron, nickel or cobalt.

The magnets 19 and 20 may be for example integral permanent magnets having a permanent magnetization. The permanent magnets may be mounted onto the front or rear side of the semiconductor chip 10, e.g. by adhesive bonding. The permanent magnets may comprise any permanent-magnetic material, such as e.g. AlNiCo alloys, FeTb alloys, ferrite compounds, rare earths, samarium or neodymium.

As an alternative to an integral permanent magnet, a permanent-magnetic thin layer may be applied on the front or rear side of the semiconductor chip 10, e.g. by sputtering, vapour deposition or electrodeposition. By way of example, the same materials as for the integral permanent magnets may be used as materials for the permanent-magnetic thin layers.

A permanent-magnetic layer is often only weakly magnetized after deposition onto the semiconductor chip 10. Therefore, it may be necessary to magnetize the layer after deposition. By way of example, for this purpose the semiconductor components 300 or 400 may be exposed to a sufficiently high magnetic field during a heat treatment step. In this case, the orientation of the magnetization may also be influenced under certain circumstances.

FIGS. 6A to 6D schematically illustrate a method for producing the component 200 as an exemplary embodiment of the invention. The method involves firstly providing a carrier 21, into which a plurality of circuits are integrated. Said circuits include the magnetic field sensor 11 and possibly further circuits which the semiconductor chip 10 comprises. The carrier 21 may be for example a semiconductor wafer 21, e.g. a silicon wafer.

Figure 6A:
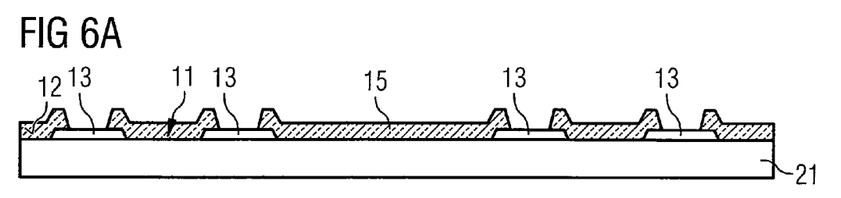
FIGS. 6A to 6D show schematic illustrations of a method for producing the semiconductor component 200 as a further exemplary embodiment of the invention.
Figure 6B:
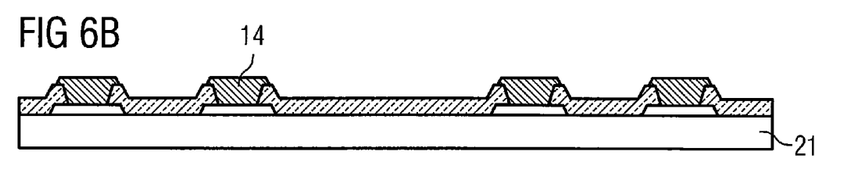
Figure 6C:
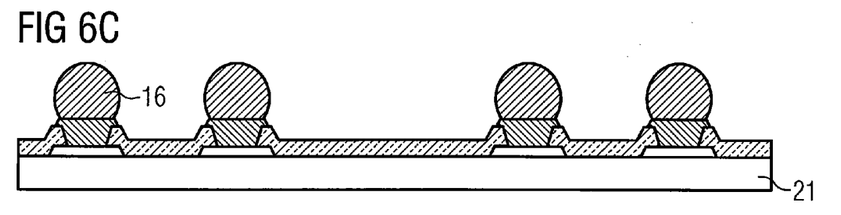
Figure 6D:
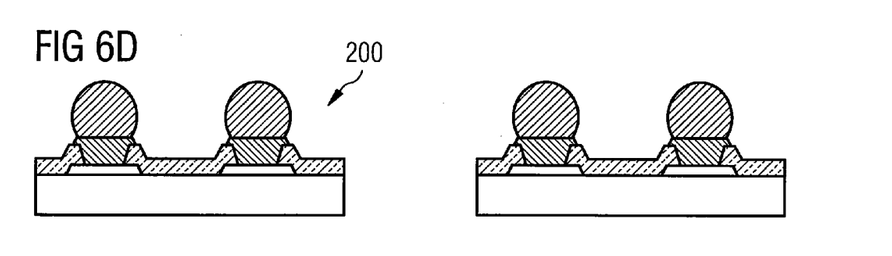

As is shown in FIG. 6A, the structured metalization layer 13, and also the passivation layer 15 is applied to the active main surface 12 of the semiconductor wafer 21. If appropriate, a rewiring layer may also be applied to the semiconductor wafer 21. The underbump metalizations 14 (cf. FIG. 6B) and the solder balls 16 (cf. FIG. 6C) are subsequently applied. Furthermore, it is possible to apply the magnets 19 or 20 whilst still at the wafer level. Since wafer process technologies can still be used in this production stage, it is particularly favourable in respect of outlay to deposit a permanent-magnetic thin layer on the active main surface 12 of the semiconductor wafer 21. This furthermore has the advantage that the permanent-magnetic layer is situated in direct proximity to the magnetic field sensor 11.

After the application of the external contact elements, which in FIG. 6 comprise the structured metalization layer 13, the underbump metalizations 14 and the solder balls 16, to the active main surface 12 of the semiconductor wafer 21, the individual semiconductor chips of the semiconductor wafer 21 can be singulated, e.g. by sawing.

Figure 7:
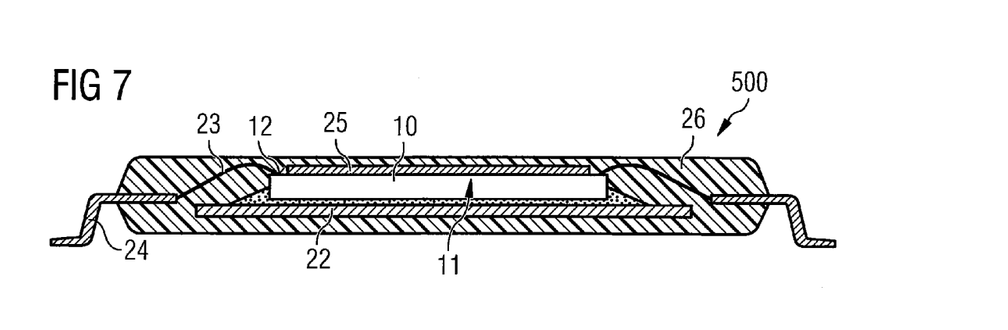
FIG. 7 shows a schematic illustration of a semiconductor component 500 as a further exemplary embodiment of the invention.

FIG. 7 illustrates a semiconductor component 500 in cross section as a further exemplary embodiment of the invention. In contrast to the semiconductor components 100 to 400, the semiconductor component 500 is not a wafer level package.

As is shown in FIG. 7, the semiconductor chip 10, into which the magnetic field sensor 11 is integrated, was mounted onto a carrier 22, for example a die pad of a leadframe that is composed of sheet copper. The active main surface 12 of the semiconductor chip 10 is oriented upwards in this case. The contact elements of the active main surface 12 are connected to external contact elements 24 via connecting lines 23, in particular bonding wires. Electrical contact can be made with the semiconductor chip 10 from outside the semiconductor component 500 via the external contact elements 24. The external contact elements 24 may be e.g. metallic pins of a leadframe. As is shown in FIG. 7, the pins 24 may be angled in order that they can be applied to a printed circuit board and be soldered there.

A magnet 25 is applied to the active main surface 12 of the semiconductor chip 10. The magnet 25 may be configured just like the magnets 19 and 20 of the semiconductor components 300 and 400, respectively, described above. Consequently, the magnet 25 may be an integral permanent magnet that is adhesively bonded to the semiconductor chip 10, for example, or a permanent-magnetic thin structured layer may be deposited on the semiconductor chip 10.

As is shown in FIG. 7, the carrier 22 and also the components arranged on the carrier 22 are integrated together with the magnet 25 into a housing. The housing may comprise a potting material 26, e.g. a plastic material, which envelops a carrier 22 and also the components arranged thereon. Only the ends of the pins 24 were left free in order to enable contact to be made with the semiconductor chip 10 externally.

One advantage of the semiconductor component 500 is that the magnet 25 is situated in direct proximity to the magnetic field sensor 11 just like in the case of the semiconductor components 300 and 400.

As an alternative to the contact-making by means of wire bonding technology as shown in FIG. 7, contact can be made with the semiconductor chip 10 by means of a flip-chip technology, too.

Figure 8A:
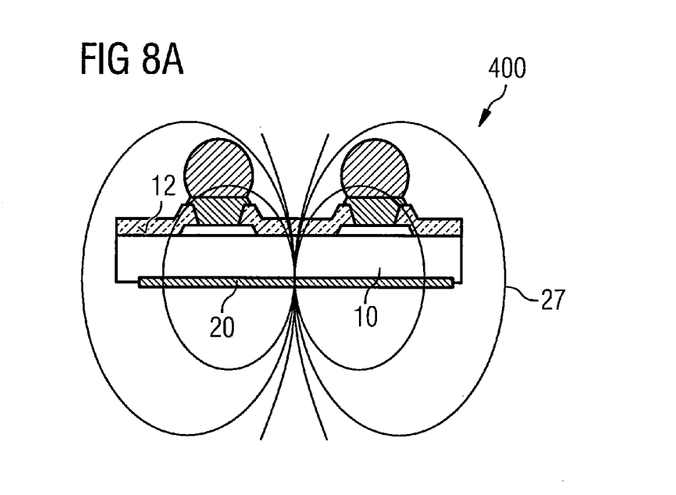
FIGS. 8A and 8B show schematic illustrations of the magnetic field lines 27 generated by the semiconductor component 400.
Figure 8B:
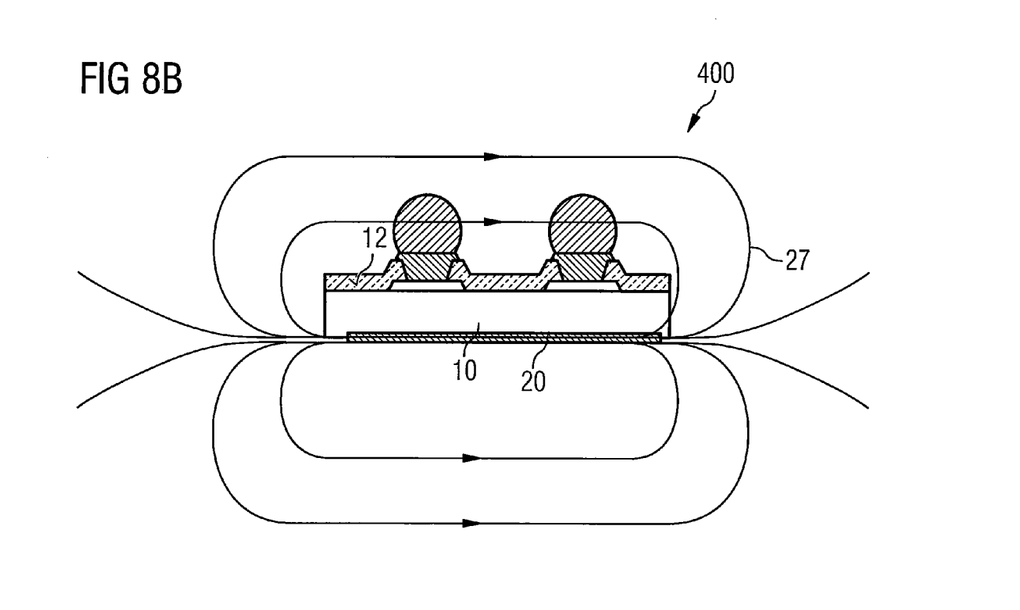

FIGS. 8A and 8B show exemplary orientations of the magnetic field generated by the magnet 20 of the semiconductor component 400. For this purpose, schematic magnetic field lines 27 are depicted in FIGS. 8A and 8B. In FIG. 8A, the magnet 20 is magnetized perpendicular to the active main surface 12 of the semiconductor chip 10, while in FIG. 8B the magnetization is oriented parallel to the active main surface 12.

In the case of an integral permanent magnet 20, the orientation of the magnetic field 27 generated by it can be determined by a corresponding orientation of the permanent magnet 20. If the magnet 20 is produced by deposition of a thin permanent-magnetic layer, there is a possibility, in principle, of setting a desired orientation of the magnetic field 27 by means of a subsequent magnetization step. This is not possible, however, for all permanent-magnetic materials. If e.g. a perpendicular orientation of the magnetic field 27 is required for a specific application (cf. FIG. 8A), a material which exhibits an intrinsic perpendicular anisotropy in layer form can be chosen for the thin permanent-magnetic layer deposited on the semiconductor chip 10. Such an intrinsic perpendicular anisotropy is exhibited by FeTb alloys, for example.

Figure 9:
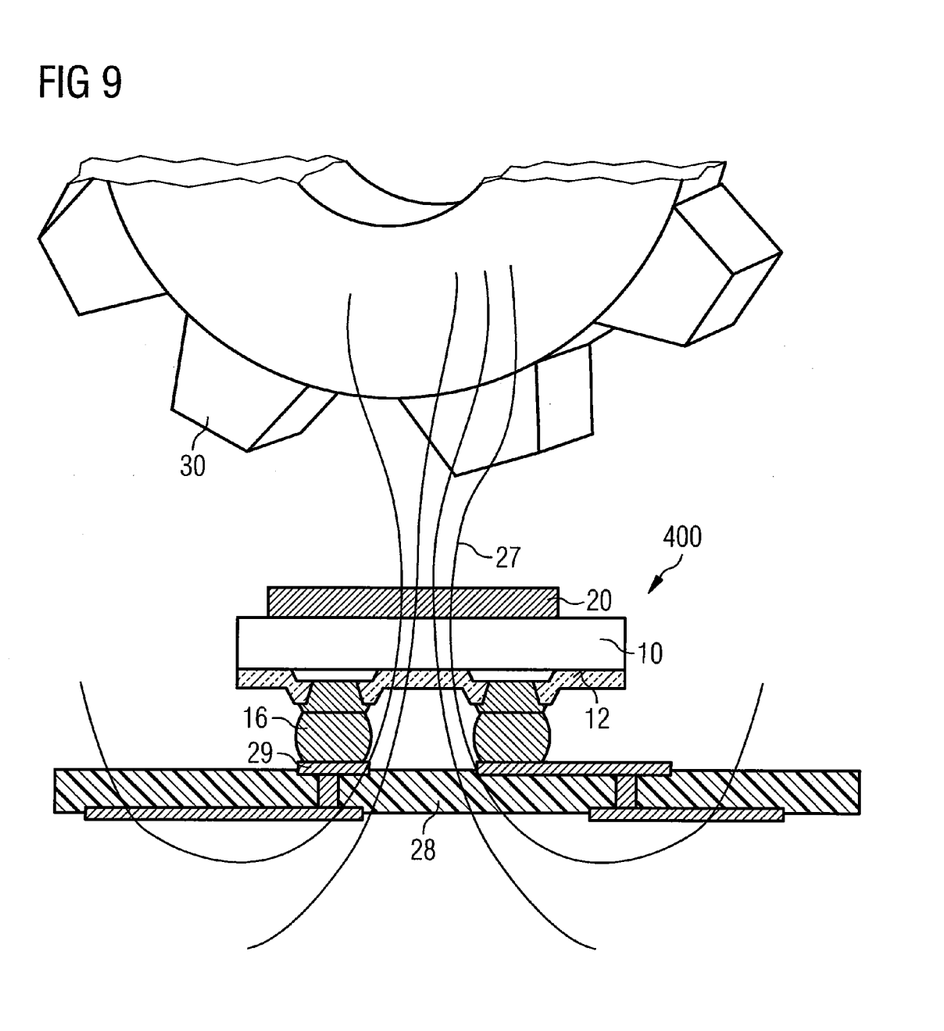
FIG. 9 shows a schematic illustration of an application of the semiconductor component 400 as a rate-of-rotation sensor.

FIG. 9 illustrates by way of example an application of the semiconductor component 400 as a rate-of-rotation sensor. The semiconductor component 400 is mounted onto a printed circuit board 28 in a flip-chip position. Soldering connections between the semiconductor component 400 and contact elements 29 of the printed circuit board 28 were produced by means of the solder balls 26. A gearwheel 30 made of a soft-magnetic material having a low coercive field strength is arranged within the magnetic field 27 generated by the magnet 20. Upon rotation of the gearwheel 30, the magnetic field 27 changes periodically on account of the structure of the gearwheel 30, as is shown in FIG. 9. Such changes in the magnetic field 27 are measured by the magnetic field sensor 10. An evaluation circuit integrated into the semiconductor chip 10 can determine the rate of rotation of the gearwheel 30 on the basis of the periodically recurring measurement data supplied by the magnetic field sensor 10.

In the application in accordance with FIG. 9, an orientation of the magnetization of the magnet 20 perpendicular to the active main surface 12 is favourable since it is thereby possible to detect changes in the magnetic field 27 with a high accuracy.

In the application of the semiconductor components described here, a magnet need not necessarily be integrated into the semiconductor component. By way of example, it may also be provided that a magnet is fixed to a counter-workpiece and the magnetic field sensor 10 measures whether or not the counter-workpiece is situated in the vicinity of the semiconductor component or whether or not the counter-workpiece is approaching the semiconductor component. Instead of measuring the rate of rotation of a rotating gearwheel, this application may also be used for measuring angles of rotation of rotary articulations, e.g. in clamshell telephones or in the surroundings of doors. It is thus possible to ascertain whether the clamshell telephone or a door is open or closed.

Figure 10:
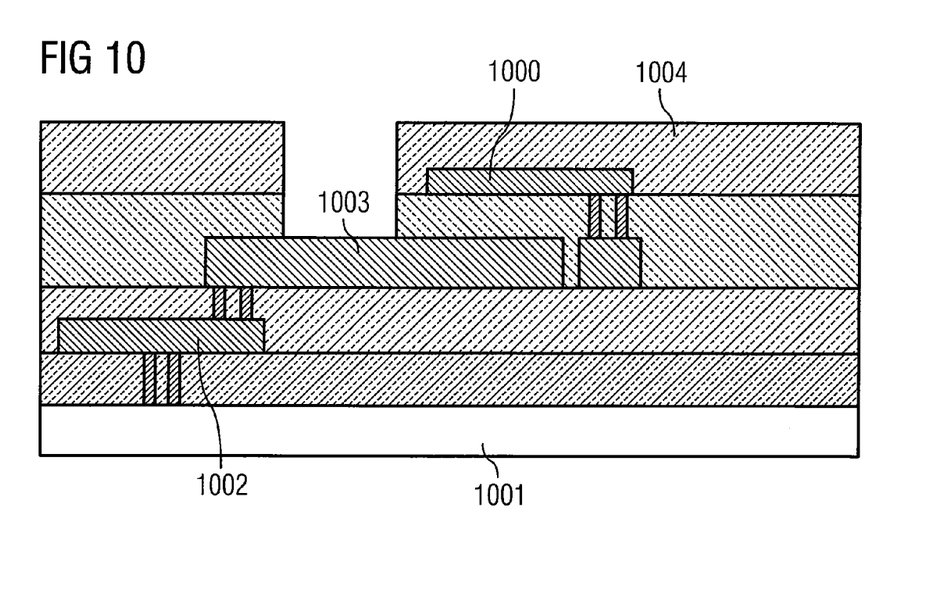
FIG. 10 shows a schematic illustration of a magnetic field sensor 1000 integrated into a semiconductor component.

FIG. 10 schematically illustrates the cross section through a semiconductor component into which a magnetic field sensor 1000 is integrated. By way of example, the magnetic field sensors 11 may be integrated into the semiconductor components 100 to 500 in a similar manner. The magnetic field sensor 1000 utilizes e.g. the GMR effect for measuring a magnetic field. Spin valve sensors, in which thin soft-magnetic layers are separated from one another by non-magnetic layers, constitute one possibility for utilizing the GMR effect. The direction of the magnetization of at least one of the soft-magnetic layers is fixed by suitable means, for example an antiferromagnetic layer. The magnetizations of the other soft-magnetic layers can rotate freely in a magnetic field applied from outside the semiconductor component. The fact that the electrical resistance between the soft-magnetic layers depends on the angle between the magnetizations of the individual layers is utilized for measurement of the external magnetic field.

FIG. 10 shows that metalization layers 1002 and 1003 are applied to a semiconductor chip 1001, said metalization layers being connected to one another by via connections. The magnetic field sensor 1000 is arranged thereabove, said magnetic field sensor having been coated with a passivation layer 1004.

Figure 11:
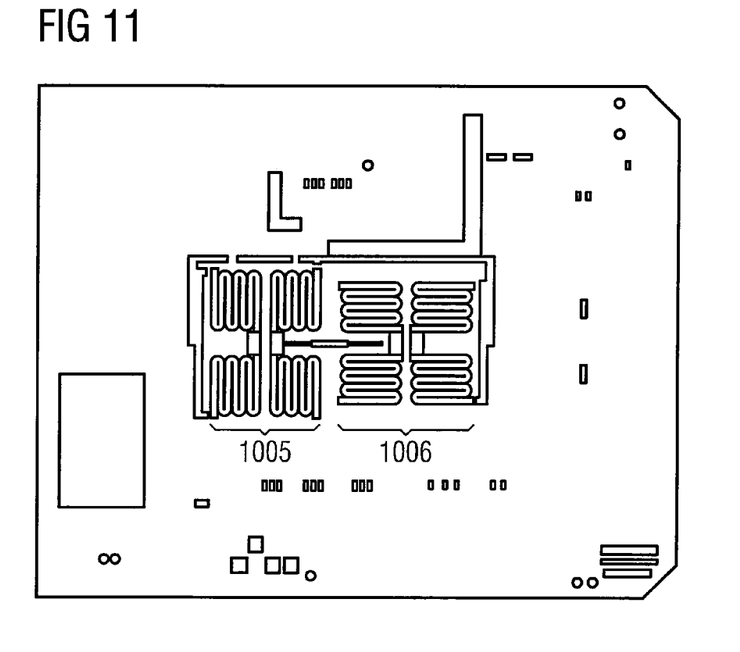
FIG. 11 shows a micrograph of a part of a magnetic field sensor.

FIG. 11 shows a micrograph—recorded by a microscope—of a GMR magnetic field sensor integrated into a semiconductor component for the measurement of angles of rotation. The GMR magnetic field sensor has two full bridges 1005 and 1006, which are offset by 90°. Each of the full bridges 1005 and 1006 comprises two series-connected half-bridges each having a meandering structure. The two full bridges 1005 and 1006 are in each case connected up as a Wheatstone bridge. Each of the two full bridges 1005 and 1006 enables the unambiguous assignment to an angular range of 180°. The use of two full bridges 1005 and 1006 offset by 90° makes it possible to cover the full 3600 range with the aid of an arctan calculation.

Figure 12:
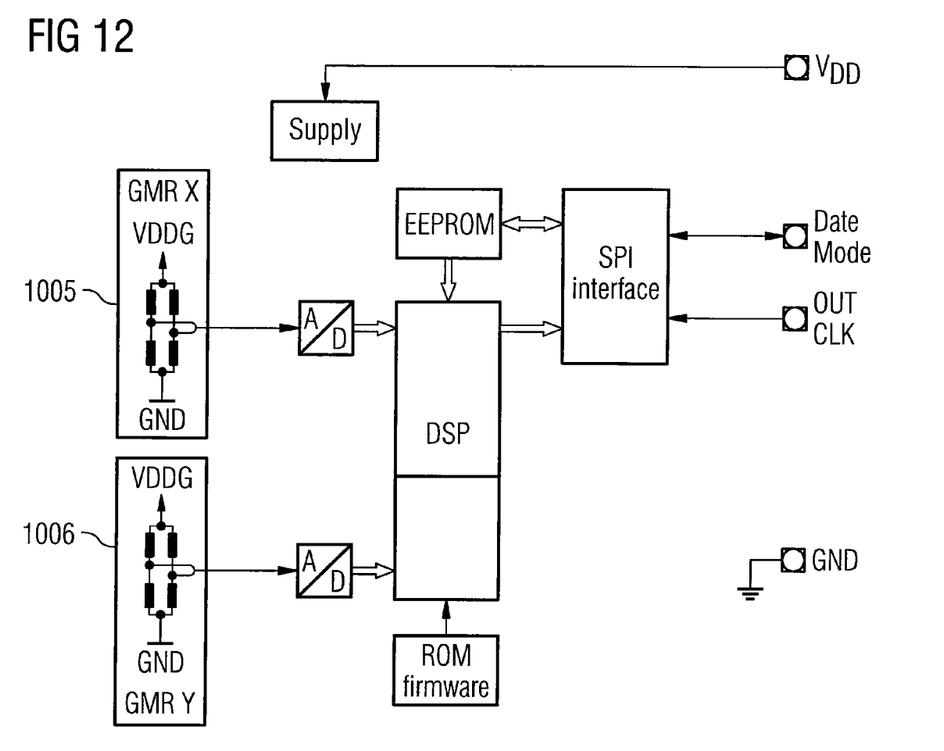
FIG. 12 shows a schematic illustration of a magnetic field sensor and an evaluation circuit.

FIG. 12 shows an evaluation circuit for evaluating the measurement signals supplied by the full bridges 1005 and 1006. A digital signal processor (DSP) serves to execute the required calculations in order to convert the signal into an angle in the 360° range after an offset subtraction. The evaluation circuit illustrated in FIG. 12 can be integrated together with the GMR magnetic field sensor onto a semiconductor chip.

The invention claimed is:

1. A semiconductor component comprising:
   a semiconductor chip configured as a wafer level package, the semiconductor chip comprising a first main surface and a second main surface opposite the first main surface, wherein the first main surface is an active main surface;
   a magnet disposed on the second main surface of the semiconductor chip, wherein a dimension of the magnet in a direction parallel to the active main surface is smaller than or equal to a dimension of the semiconductor chip in the direction parallel to the active main surface, wherein a north pole and a south pole of the magnet define an axis, and wherein the magnet is arranged on the second main surface such that the axis is perpendicular to the active main surface, wherein the magnet comprises a permanent-magnetic layer deposited on the second main surface of the semiconductor chip, wherein the permanent-magnetic layer comprises an intrinsic anisotropy in a direction perpendicular to the active main surface; and
   a magnetic field sensor integrated into the semiconductor chip.

2. The semiconductor component of claim 1, further comprising:
   a second magnet disposed on the first main surface of the semiconductor chip.

3. The semiconductor component of claim 2, wherein the second magnet comprises a layer made of a permanent magnetic material deposited on the first main surface of the semiconductor chip.

4. The semiconductor component of claim 2, wherein the second magnet comprises an integral permanent magnet mounted onto the first main surface of the semiconductor chip.

5. The semiconductor component of claim 1, further comprising external contact elements disposed on the active main surface of the semiconductor chip, the external contact elements comprising solder deposits arranged for flip chip mounting, wherein the external contact elements comprise an underbump metalization.

6. The semiconductor component of claim 1, further comprising:
   further comprising external contact elements disposed on the active main surface of the semiconductor chip, the external contact elements comprising solder deposits arranged for flip chip mounting; and a rewiring layer arranged between the semiconductor chip and the external contact elements.

7. The semiconductor component of claim 1, wherein the semiconductor chip is configured as at least one of a position sensor, a rate of rotation sensor, a part of a position sensor, and a part of a rate of rotation sensor.

8. The semiconductor component of claim 1, wherein the magnet comprises a deposited layer comprising permanent magnetic material deposited directly on the second main surface of the semiconductor chip.

9. The semiconductor component of claim 1, wherein the magnet comprises an integral permanent magnet mounted directly onto the second main surface of the semiconductor chip.

10. The semiconductor chip of claim 1, wherein a dimension of the magnet in the direction parallel to the active main surface equals the dimension of the semiconductor chip in the direction parallel to the active main surface.

11. A semiconductor component comprising:
a semiconductor chip, into which a magnetic field sensor is integrated, the semiconductor chip comprising an active main surface and a second main surface opposite the active main surface;
a magnet disposed on the second main surface of the semiconductor chip, wherein a dimension of the magnet in a direction parallel to the active main surface is smaller than or equal to a dimension of the semiconductor chip in the direction parallel to the active main surface, wherein a north pole and a south pole of the magnet define an axis, and wherein the magnet is arranged on the second main surface such that the axis is perpendicular to the main active surface, wherein the magnet comprises a permanent-magnetic layer deposited on the second main surface of the semiconductor chip, wherein the permanent-magnetic layer comprises an intrinsic anisotropy in a direction perpendicular to the active main surface; and
external contact elements disposed on the active main surface of the semiconductor chip, the external contact elements comprising solder deposits arranged for flip chip mounting.

12. The semiconductor component of claim 11, further comprising:
a second magnet disposed on the active main surface of the semiconductor chip.

13. The semiconductor component of claim 12, wherein the second magnet comprises a layer made of a permanent magnetic material deposited on the active main surface of the semiconductor chip.

14. The semiconductor component of claim 12, wherein the second magnet comprises an integral permanent magnet mounted onto the active main surface of the semiconductor chip.

15. The semiconductor component of claim 11, wherein the external contact elements comprise an underbump metallization.

16. The semiconductor component of claim 11, further comprising:
a rewiring layer arranged between the active main surface of the semiconductor chip and the external contact elements.

17. A semiconductor component comprising:
a semiconductor chip configured as a wafer level package, the semiconductor chip comprising a first main surface and a second main surface opposite the first main surface, wherein the first main surface is an active main surface;
a magnet disposed on the second main surface of the semiconductor chip, wherein a dimension of the magnet in a direction parallel to the active main surface is smaller than or equal to a dimension of the semiconductor chip in the direction parallel to the active main surface, wherein a north pole and a south pole of the magnet define an axis, and wherein the magnet is arranged on the second main surface such that the axis is perpendicular to the active main surface; and
a magnetic field sensor integrated into the semiconductor chip.

18. A semiconductor component comprising:
a semiconductor chip configured as a wafer level package, the semiconductor chip comprising a first main surface and a second main surface opposite the first main surface, wherein the first main surface is an active main surface;
a magnet disposed on the second main surface of the semiconductor chip, the magnet comprising an integral permanent magnet, wherein a dimension of the magnet in a direction parallel to the active main surface is smaller than or equal to a dimension of the semiconductor chip in the direction parallel to the active main surface, wherein the integral permanent magnet is mounted directly onto the second main surface of the semiconductor chip; and
a magnetic field sensor integrated into the semiconductor chip.

19. A semiconductor component comprising:
a semiconductor chip, into which a magnetic field sensor is integrated, the semiconductor chip comprising an active main surface and a second main surface opposite the active main surface;
a magnet disposed on the second main surface of the semiconductor chip, wherein a dimension of the magnet in a direction parallel to the active main surface is smaller than or equal to a dimension of the semiconductor chip in the direction parallel to the active main surface, wherein a north pole and a south pole of the magnet define an axis, and wherein the magnet is arranged on the second main surface such that the axis is parallel to the active main surface; and
external contact elements disposed on the active main surface of the semiconductor chip.

* * * * *